United States Patent [19]

Brown et al.

[11] Patent Number: 5,227,314

[45] Date of Patent: Jul. 13, 1993

[54] METHOD OF MAKING METAL CONDUCTORS HAVING A MOBILE INN GETTERER THEREIN

[75] Inventors: George N. Brown, Spring Township, Berks County; Luke J. Howard; William F. Rimmler, both of Exeter Township, Berks County, all of Pa.

[73] Assignee: AT&T Bell Laboratories, Murray Hill, N.J.

[21] Appl. No.: 841,247

[22] Filed: Feb. 24, 1992

Related U.S. Application Data

[60] Continuation of Ser. No. 638,604, Jan. 8, 1991, abandoned, which is a division of Ser. No. 327,216, Mar. 22, 1989, Pat. No. 5,016,081.

[51] Int. Cl.$^5$ .................................. H01L 21/306
[52] U.S. Cl. ............................ 437/10; 437/12; 437/197; 148/DIG. 60
[58] Field of Search ............... 148/DIG. 60; 437/10, 437/12, 197

[56] References Cited

U.S. PATENT DOCUMENTS

| | | | |
|---|---|---|---|
| 4,017,890 | 4/1977 | Howard et al. | 357/67 |
| 4,053,335 | 10/1977 | Hu | 437/51 |
| 4,154,874 | 5/1979 | Howard et al. | 437/197 |
| 4,349,395 | 9/1982 | Toyokura et al. | 437/12 |
| 4,561,009 | 12/1985 | Yonezawa et al. | 357/67 |
| 4,563,368 | 1/1986 | Tihanyi et al. | 148/DIG. 60 |
| 4,732,865 | 3/1988 | Evans et al. | 437/12 |
| 4,899,206 | 2/1990 | Sakurai et al. | |

FOREIGN PATENT DOCUMENTS

| | | | |
|---|---|---|---|
| 53-62480 | 6/1978 | Japan. | |
| 57-023231 | 2/1982 | Japan | 437/10 |
| 59-084432 | 5/1984 | Japan | 437/12 |
| 61-159741 | 7/1986 | Japan | 437/12 |
| 1-214126 | 8/1989 | Japan | 437/12 |
| 1-234549 | 9/1989 | Japan | 437/12 |

OTHER PUBLICATIONS

C. A. Hippsley et al., "Effects of Chromium on Crack Growth and Oxidation..." *Acta Mettal. Material*, vol. 38, No. 12, pp. 2393–2410, Dec. 1990.

VLSI Technology, First Edition, 1983, pp. 255–257, by Sze.

Primary Examiner—Brian E. Hearn
Assistant Examiner—Laura M. Holtzman
Attorney, Agent, or Firm—Scott W. McLellan

[57] ABSTRACT

A mobile ion getterer is added to metalization layers on an integrated circuit or discrete device to reduce mobile ion contamination therein. Preferably, chromium is used as the mobile ion getterer and is added to an aluminum target used as the metal source for sputtering the chromium and aluminum onto the integrated circuit or discrete device. This technique removes the need for ultrahigh purity aluminum conductors or gettering material (P-glass) in contact with the metal conductors. This technique may be used with virtually all metalization apparatus and processes used for depositing metal onto semiconductor devices.

4 Claims, 2 Drawing Sheets

METHOD OF MAKING METAL CONDUCTORS HAVING A MOBILE INN GETTERER THEREIN

This application is a continuation of application Ser. No. 07/638,604, filed on Jan. 8, 1991, now abandoned, which is a division of application Ser. No. 07/327,216 filed Mar. 22, 1989, now U.S. Pat. No. 5,016,081.

FIELD OF THE INVENTION

This invention relates to silicon integrated circuits and discrete devices generally, and more specifically, to the suppression of mobile ion contamination from metal conductors on integrated circuits and discrete devices.

BACKGROUND OF THE INVENTION

It is known that metal-oxide-semiconductor field-effect transistors (MOSFETs) have certain electrical characteristics which vary with time and voltage bias. These variations in electrical characteristics are particularly noticeable in large gate area MOSFETs, such as power MOSFETs. For example, one such electrical characteristic, the turn-on voltage or threshold voltage of an MOSFET, has been measured to vary over 500 millivolts from an exemplary desired voltage of two volts. This amount of variation can make circuits using these devices inoperable. The most widely recognized reason for the variations results from mobile ion contamination of the MOSFET by mobile ions present in dielectrics. Typically the source of such contamination is ionized sodium (Na+) found in silicon dioxide, which is used as gate insulator material for the MOSFETs and as the insulator between adjacent conductors in integrated circuits.

The mobile ions in the silicon dioxide gate insulator shift the threshold voltage of the corresponding MOSFET due to the charge of the mobile ions. This effect can be understood with reference to FIG. 3 which shows a portion of the exemplary MOSFET 1. Mobile ions (Na+) migrate from several sources (one of which is the conductor metal 6, discussed below) through the gate insulator 3 (e.g., silicon dioxide) toward the gate 4. Some of the ions remain between the gate 4 and the MOSFET 1 channel (not shown) in the p layer. The charge on the mobile ions accumulates under the gate 4, shifting the gate voltage required to turn on the MOSFET 1 (threshold voltage) negatively, i.e., the MOSFET 1 acts as if a positive bias voltage were permanently applied to the gate 4 thereof. The number of mobile ions Na+ under the gate 4 varies with the magnitude of the bias voltage applied to the MOSFET 1 and the length of time the bias voltage is applied. A layer of phosphorus-doped glass (P-glass) 5 is deposited over the gate 4 to trap (getter) mobile ions that come in contact with it from overlying layers (not shown), the source of mobile ions resulting mainly from contaminated manufacturing equipment. However, a second source of the mobile ions is the aluminum conductor 6, shown here contacting the n+ source (or drain) of the MOSFET 1. Since the conductor 6 is in direct contact with the insulator 3, the P-glass 5 cannot getter all the mobile ions added to the insulator 3 from the conductor 6.

In the manufacture of MOSFET 1, the source of aluminum for the conductor 6 is typically an aluminum target, having added thereto a small amount of copper to reduce electromigration of the aluminum at high current densities. Other metals may also be alloyed with the aluminum, such as silicon and titanium. The aluminum target is used in a sputtering apparatus in which the aluminum and copper target is slowly vaporized and deposited onto a workpiece, such as a wafer having integrated circuits or discrete devices thereon. This process is typically referred to as sputtering. If the target or the chamber used for sputtering is contaminated, then mobile ions will be introduced into the MOSFET 1. One prior art approach is to use as pure aluminum-copper alloy target as possible to minimize the introduction of mobile ions into the workpiece. However, the contamination in the sputtering chamber remains and it is difficult to obtain very high purity targets at reasonable cost. Another technique involves modifying the fabrication process such that the conductor 6 never comes into contact with the oxide 3 and the P-glass 5 completely surrounds the conductor 6. This technique complicates the fabrication process, reducing the yield of operational devices and increasing the manufacturing costs thereof.

Another deleterious effect of mobile ion contamination on integrated circuits is the formation of low conductivity paths through the silicon dioxide insulator between adjacent conductors in an integrated circuit. This effect is particularly troublesome where two conductors in different levels of metallization cross.

SUMMARY OF THE INVENTION

In accordance with our invention, the effect of mobile ion contamination in semiconductor devices is reduced without a significant increase in cost or changes to the processing steps used to make the circuits and devices.

These and other advantages of the invention are obtained generally by having at least one of the metal conductors on a semiconductor device, such as an integrated circuit or discrete device, include a mobile ion getterer. The mobile ion getterer is preferably chromium or a similar metal such as molybdenum or tungsten. These advantages are further obtained by a method for including a mobile ion getterer in the metal used as conductors on the semiconductor device. The chromium acts as a getter to reduce the diffusion of mobile ion contaminants from the metal conductors into the insulator layers of the device.

Further, these advantages can be implemented in the apparatus for applying the metal conductors to the integrated circuit and to the source of metal in the apparatus.

BRIEF DESCRIPTION OF THE DRAWING

The foregoing features of this invention, as well as the invention itself, may be more fully understood from the following detailed description of the drawings, in which.

DETAILED DESCRIPTION

To reduce the out-diffusion of mobile ion contaminants from conductors on semiconductor devices, such as integrated circuits or discrete devices, a gettering material is added to the conductor prior to, or during, deposition of the metal onto the semiconductor device. The added gettering material "getters" the mobile ion contaminants, such as ionized sodium (Na+), reducing the number of mobile ions diffusing-out of the conductor into the semiconductor device. The gettering material is referred to here as a mobile ion getterer or gettering metal. Without the addition of the mobile ion getterer to the conductor, large numbers of mobile ions will diffuse into the insulation layers of the semiconductor device, such as silicon dioxide insulator layers, from the conductors. The mobile ions form low conductivity paths between the conductors or change the threshold voltage of MOSFETs using the insulating layer to separate the gate and channel thereof, as discussed above. It is preferred, for aluminum or aluminum-copper alloy conductors, to add a small amount of chromium or similar metal to the conductors to getter the mobile ions within the conductor.

EXAMPLE

Figure 1:
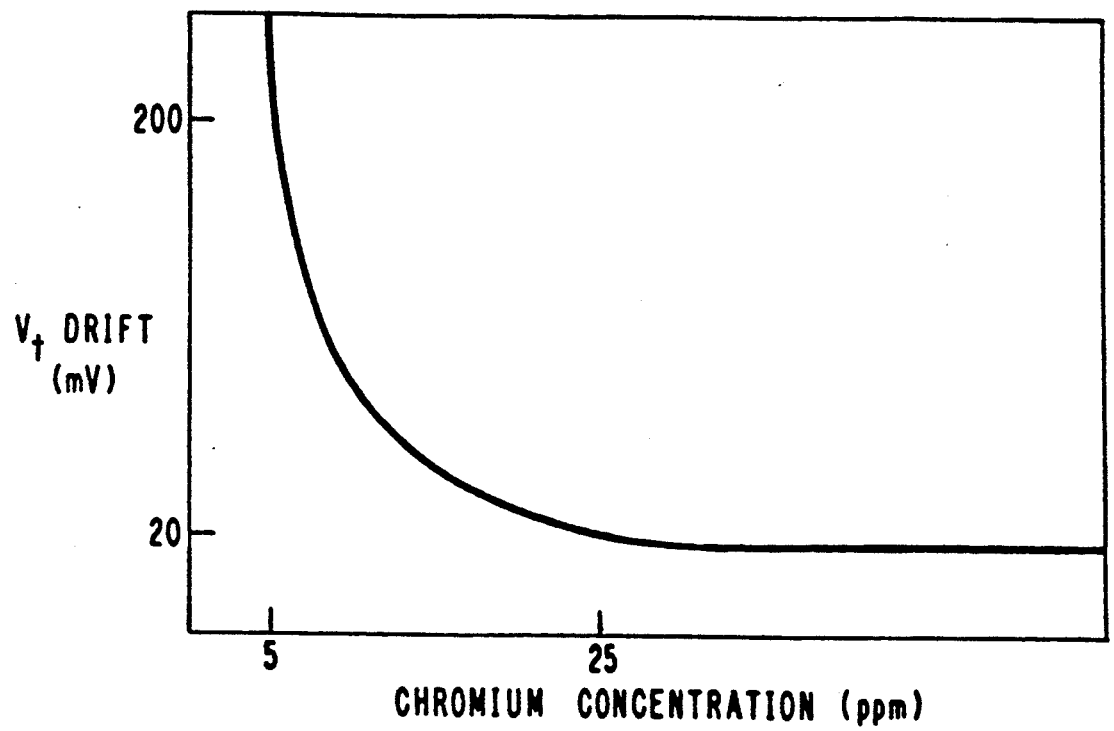
FIG. 1 is a plot of the threshold voltage drift of an exemplary MOSFET with different amounts of chromium added to the aluminum-copper alloy conductors used to contact the exemplary MOSFET.
Figure 3:
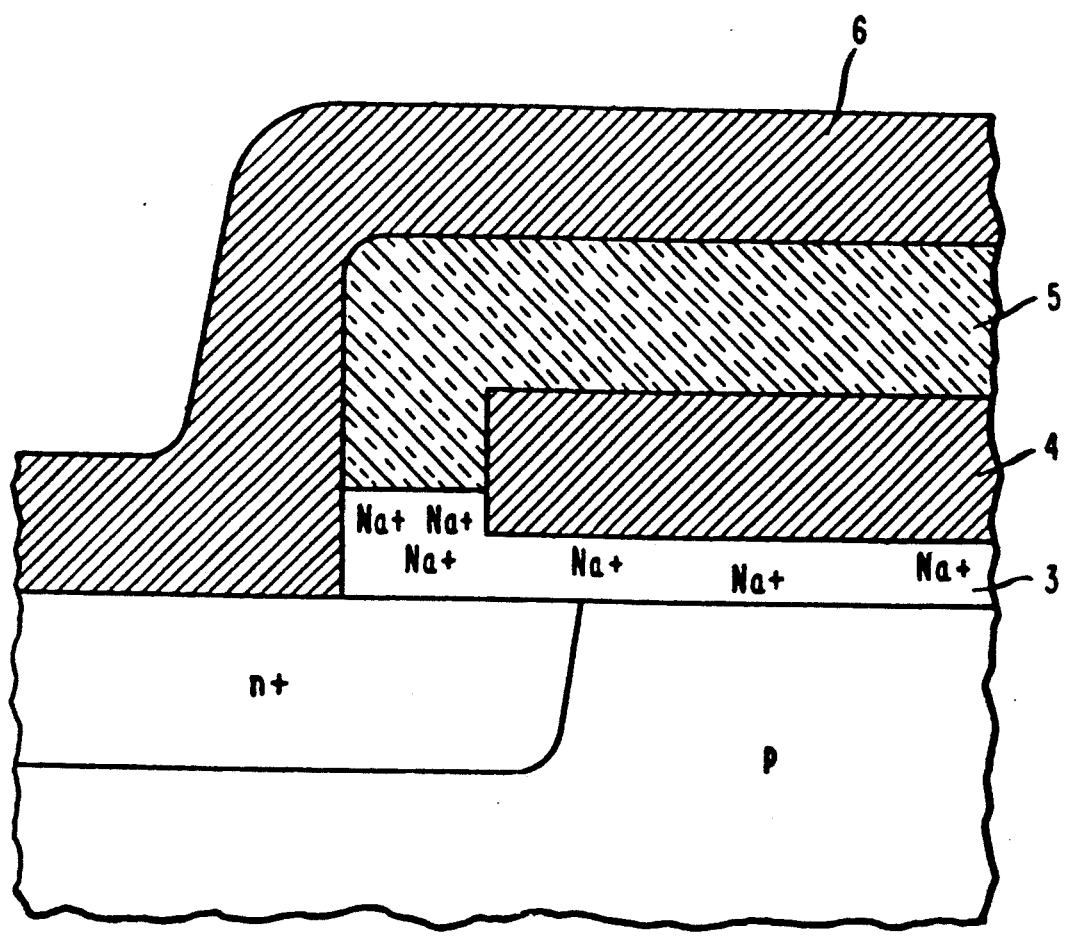
FIG. 3 is a cross-sectional diagram of the exemplary MOSFET.

In this example, the effectiveness of adding the chromium to the aluminum or aluminum-copper alloy conductor to reduce the introduction of mobile ions into a MOSFET is demonstrated in FIG. 1. The curve in FIG. 1 represents the average measured threshold voltage ($V_t$) drift (variation) of actual MOSFETs with different amounts of chromium in the aluminum-copper alloy conductors (approximately 0.5% copper). Each group of MOSFETs tested was formed on a common wafer and have substantially the same construction (similar to that shown in FIG. 3 and described above) and chromium content in the conductors, and subject to substantially the same operating time and voltage bias. At least fifteen MOSFETs were measured in each group. As shown, when less than about 5 parts-per-million (ppm) by weight of chromium was added to the aluminum-copper alloy conductors, the average threshold voltage drift was measured to exceed 200 mV. However, when approximately 25 ppm. of chromium was added to the aluminum-copper alloy conductors, the average threshold voltage drift was measured to be less than about 20 mV.

It is understood that metals having chemical properties similar to those of chromium can be used as the mobile ion getterer, such as molybdenum or tungsten. It is further understood that the concentration of the mobile ion gettering metal in the conductors is limited by the etchability, brittleness, and the maximum desired resistance of the conductors as set by manufacturing and electrical considerations. For example, the resistivity of the aluminum conductors may be limited to an exemplary maximum amount of 4 $\mu$ohm-cm. for a 1.5 $\mu$m thick film of aluminum conductor. This limit serves to assure a minimal voltage drop across the conductors at high current densities. Using the exemplary 4 $\mu$ohm-cm. resistivity as an upper limit, then the amount of chromium that can be added to the aluminum conductor may be limited to approximately 7% by weight.

Figure 2:
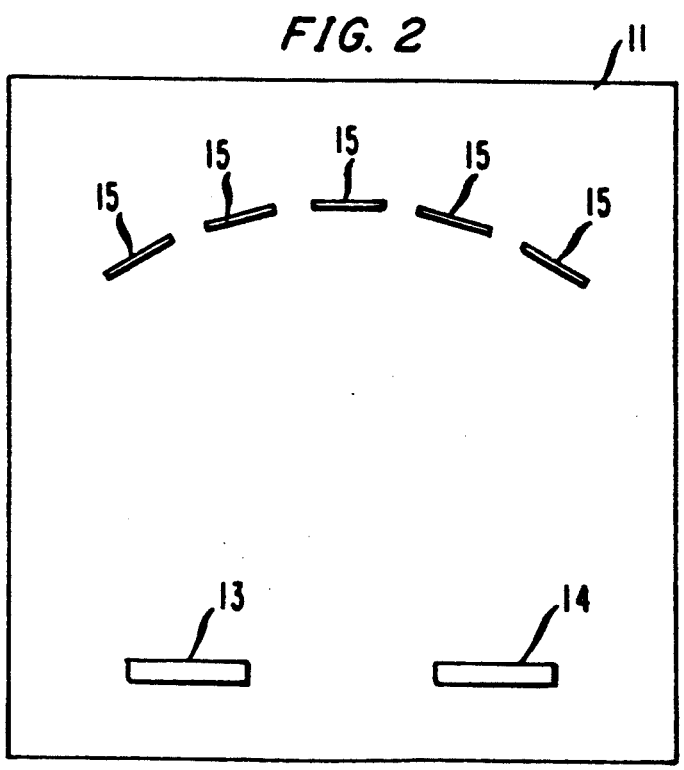
FIG. 2 is a simplified diagram of a multiple target sputtering apparatus.

The mobile ion gettering metal is preferably added to the aluminum or aluminum alloy target used as the source of metal for deposition onto a wafer, e.g., in a target used in a conventional sputterer, such as a Model 3190 sputterer by Varian Associates of Palo Alto, Calif. It is understood, however, that a second target having the mobile ion getterer therein can be used in conjunction with the conventional aluminum or aluminum-copper alloy target in the sputterer to introduce the desired amount of gettering metal into the deposited metal. A diagram of an exemplary multiple target sputterer is shown in FIG. 2. A chamber 11 houses targets 13, 14 and workpieces 15 (usually silicon wafers). For purposes here, target 13 provides the aluminum, aluminum-copper, aluminum-silicon or aluminum-silicon-titanium alloys for sputtering onto the workpieces 15 while target 14 provides the mobile ion getterer. It is also understood that other apparatus and methods for depositing metal can be used that allows for the addition of a mobile ion gettering metal into the conventional metal conductors, e.g., evaporation and chemical vapor deposition.

Having described the preferred embodiment of this invention, it will now be apparent to one of skill in the art that other embodiments incorporating its concept may be used. It is felt, therefore, that this invention should not be limited to the disclosed embodiment, but rather should be limited only by the spirit and scope of the appended claims.

What is claimed is:

1. A method for making semiconductor devices, including the steps of forming at least one metal conductor on an integrated circuit, the steps of forming the metal conductor comprising the step of depositing a single, cosputtered layer of metal containing aluminum and a mobile ion getterer of chromium, in contact with insulating layers formed on the integrated circuit, for reducing the out-diffusion of mobile ion contaminates from the metal conductor into the insulating layers; wherein the concentration of the mobile ion getterer is less than 7 percent by weight.

2. The method for making semiconductor devices as recited in claim 1, wherein the concentration of the mobile ion getterer in the metal conductors is at least about 5 parts-per million.

3. The method for making semiconductor devices as recited in claim 2, wherein the metal layer includes copper.

4. The method for making semiconductor devices as recited in claim 3, wherein the insulating layers are silicon dioxide.

* * * * *